United States Patent
Huang

(10) Patent No.: US 11,624,559 B2
(45) Date of Patent: Apr. 11, 2023

(54) LIQUID-COOLING RADIATOR

(71) Applicant: Huizhou Hanxu Hardware Plastic Technology Co., Ltd., Guangdong (CN)

(72) Inventor: Tsung-Hsien Huang, Guangdong (CN)

(73) Assignee: HUIZHOU HANXU HARDWARE PLASTIC TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/412,278

(22) Filed: Aug. 26, 2021

(65) Prior Publication Data

US 2022/0381516 A1 Dec. 1, 2022

(30) Foreign Application Priority Data

May 28, 2021 (CN) .......................... 202110592627.0

(51) Int. Cl.
   *F28D 7/16* (2006.01)
   *H05K 7/20* (2006.01)

(52) U.S. Cl.
   CPC ....... *F28D 7/1615* (2013.01); *H05K 7/20254* (2013.01); *H05K 7/20272* (2013.01)

(58) Field of Classification Search
   CPC F28D 7/1615; F28D 15/0283; F28F 2250/08; H05K 7/20254; H05K 7/20272
   See application file for complete search history.

(56) References Cited

U.S. PATENT DOCUMENTS

| 1,306,976 | A | * | 6/1919 | Searles | F04D 25/166 |
| | | | | | 165/121 |
| 4,881,580 | A | * | 11/1989 | Murphy | F28D 15/0283 |
| | | | | | 269/21 |
| 9,772,142 | B2 | * | 9/2017 | Tsai | F04D 29/5806 |
| 11,248,848 | B1 | * | 2/2022 | Huang | F28D 1/0341 |
| 2004/0052049 | A1 | * | 3/2004 | Wu | H01L 23/473 |
| | | | | | 257/E23.098 |
| 2005/0168079 | A1 | * | 8/2005 | Wos | F04D 13/06 |
| | | | | | 310/67 R |
| 2006/0051222 | A1 | * | 3/2006 | Lee | F04D 13/0666 |
| | | | | | 417/423.1 |

(Continued)

FOREIGN PATENT DOCUMENTS

KR   20100111977 A * 4/2009
KR   20110002554 A * 1/2011

OTHER PUBLICATIONS

Translation of KR20100111977A entitled TRANSLATION-KR20100111977A (Year: 2010).*

(Continued)

*Primary Examiner* — Paul Alvare
(74) *Attorney, Agent, or Firm* — Leong C. Lei

(57) ABSTRACT

A liquid-cooling radiator includes liquid pipes, heat-dissipating fins arranged on the liquid pipes, two reservoirs, a liquid-collecting box, a liquid pump, and a heat-dissipating base. The two reservoirs are mounted to two ends of the liquid pipes, respectively. The reservoir at one end is partitioned into a first cold liquid reservoir and a second cold liquid reservoir, and the reservoir at the other end is partitioned into a first hot liquid reservoir and a second hot liquid reservoir, thereby forming a bilateral circulation.

8 Claims, 15 Drawing Sheets

(56) References Cited

U.S. PATENT DOCUMENTS

| | | | | |
|---|---|---|---|---|
| 2006/0137863 A1* | 6/2006 | Lee | ........................ | G06F 1/20 |
| | | | | 361/699 |
| 2013/0126136 A1* | 5/2013 | Hwang | ............... | F28F 9/0275 |
| | | | | 165/144 |
| 2017/0359920 A1* | 12/2017 | Huang | ................... | H01L 23/34 |
| 2017/0367217 A1* | 12/2017 | Xiao | ................... | H01L 23/467 |
| 2019/0075681 A1* | 3/2019 | Xiao | ...................... | H01L 23/34 |
| 2019/0090384 A1* | 3/2019 | Xiao | ...................... | F28F 1/126 |
| 2020/0185306 A1* | 6/2020 | Xiao | ................... | H01L 23/467 |
| 2020/0214176 A1* | 7/2020 | Tokeshi | ............. | H01L 23/3672 |

OTHER PUBLICATIONS

Translation of KR20110002554A entitled TRANSLATION-KR20110002554A (Year: 2011).*

* cited by examiner

LIQUID-COOLING RADIATOR

BACKGROUND OF THE INVENTION

1. Field of the Invention

The present invention relates to a radiator, and more particularly to a liquid-cooling radiator able to improve the heat dissipation effect.

2. Description of the Prior Art

A conventional liquid-cooling radiator assembly usually consists of a liquid-cooling radiator, a liquid-cooling block and a liquid pipe. The liquid pipe is connected between the liquid-cooling radiator and the liquid-cooling block. The liquid pipe is configured to circulate the liquid in the liquid-cooling radiator and the liquid-cooling block. After the liquid absorbs heat of the liquid-cooling block, it flows into the liquid-cooling radiator to dissipate heat. The liquid after heat dissipation flows back into the liquid-cooling block. In actual use, problems such as uneven liquid flow in the pipes of the liquid-cooling radiator and poor flow rate stability are likely to occur. As a result, the heat dissipation effect is not good.

SUMMARY OF THE INVENTION

In view of the defects of the prior art, the primary object of the present invention is to provide a liquid-cooling radiator able to improve the heat dissipation effect, which effectively improves the balance and stability of liquid flow and has a better heat dissipation effect.

In order to achieve the above object, the present invention adopts the following technical solutions:

A liquid-cooling radiator comprises liquid pipes, heat-dissipating fins arranged on the liquid pipes, two reservoirs, a liquid-collecting box, a liquid pump, and a heat-dissipating base.

The liquid-collecting box is mounted in a liquid-collecting box mounting chamber. The liquid-collecting box is partitioned into a cold liquid chamber, a liquid pump mounting chamber, and a hot liquid chamber. The liquid pump is mounted in the liquid pump mounting chamber. The heat-dissipating base is mounted to a bottom of the liquid-collecting box.

The two reservoirs are mounted to two ends of the liquid pipes, respectively. The reservoir at one end is partitioned into a first cold liquid reservoir and a second cold liquid reservoir. The reservoir at the other end is partitioned into a first hot liquid reservoir and a second hot liquid reservoir. The liquid pipes include first return liquid pipes and second return liquid pipes located at two sides of the liquid-collecting box mounting chamber.

A cold liquid in the first cold liquid reservoir and the second cold liquid reservoir respectively flows into the cold liquid chamber and then flows through the heat-dissipating base together. The cold liquid absorbs heat from the heat-dissipating base to become a hot liquid. The liquid pump pumps the hot liquid to the liquid pump mounting chamber, and then the hot liquid flows from the liquid pump mounting chamber into the hot liquid chamber. The hot liquid in the hot liquid chamber flows to the first hot liquid reservoir and the second hot liquid reservoir. The hot liquid in the first hot liquid reservoir flows through the first return liquid pipes to become the cold liquid to flow back to the first cold liquid reservoir, and the hot liquid in the second hot liquid reservoir flows through the second return liquid pipes to become the cold liquid to flow back to the second cold liquid reservoir, thereby forming a bilateral circulation.

Compared with the prior art, the present invention has obvious advantages and beneficial effects. Specifically, it can be known from the above technical solutions. Through the arrangement of the liquid pipes, the reservoirs, the liquid-collecting box, the liquid pump and the heat-dissipating base, the reservoirs are partitioned into the first and second cold liquid reservoirs and the first and second hot liquid reservoirs. The cold liquid in the first and second cold liquid reservoirs flows through the first and second cold liquid pipes into the cold liquid chamber, and then flows through the heat-dissipating base together. The cold liquid absorbs the heat from the heat-dissipating base to become a hot liquid. The liquid pump pumps the hot liquid to the liquid pump mounting chamber, and then the hot liquid flows from the liquid pump mounting chamber into the hot liquid chamber. The hot liquid in the hot liquid chamber flows through the first and second hot liquid pipes to the first and second hot liquid reservoirs. The hot liquid in the first and second hot liquid reservoirs flows through the first and second return liquid pipes to become the cold liquid to flow back to the first and second cold liquid reservoirs, thereby forming a bilateral circulation. This effectively improves the balance and stability of the liquid flow and has a better heat dissipation effect.

DETAILED DESCRIPTION OF THE PREFERRED EMBODIMENTS

Figure 1:
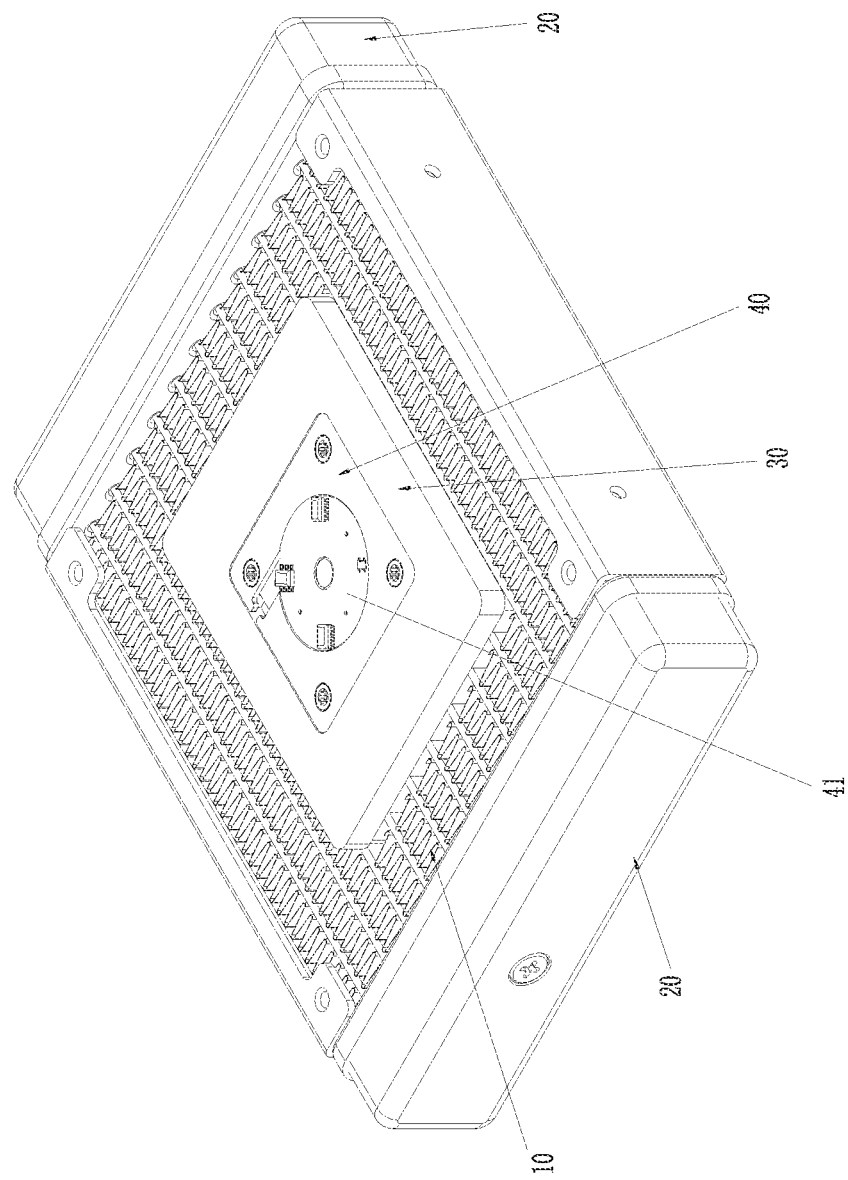
FIG. 1 is a top perspective view according to a preferred embodiment of the present invention.
Figure 2:
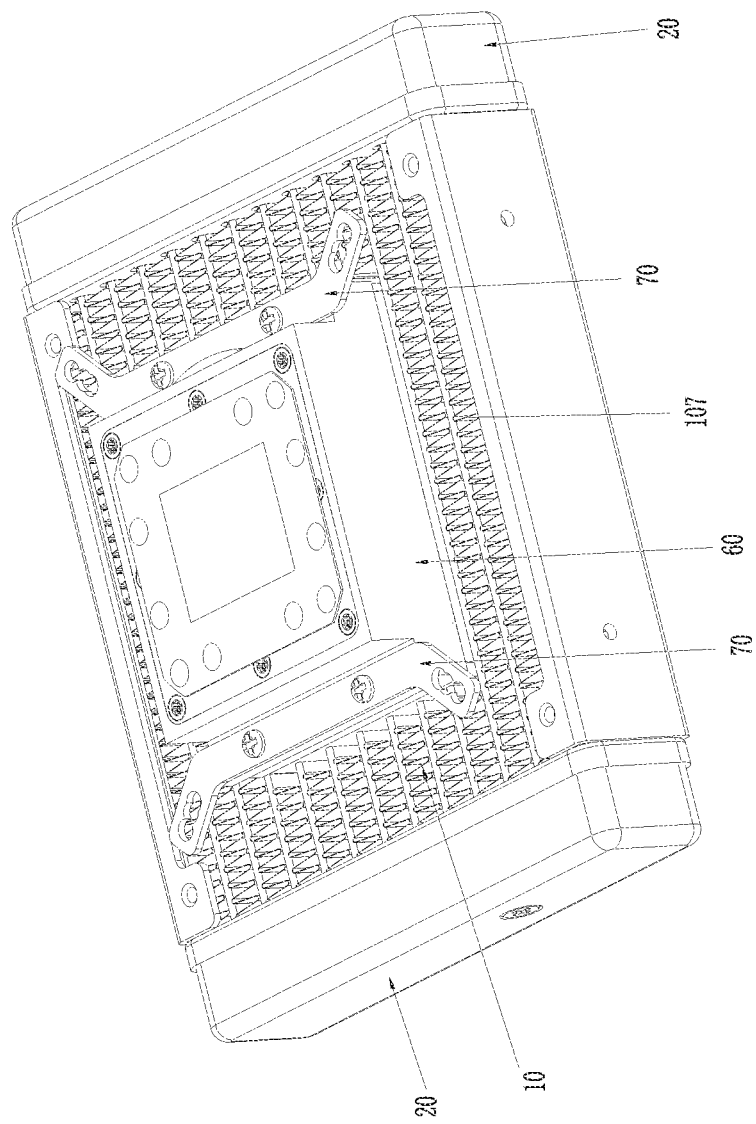
FIG. 2 is a bottom perspective view according to the preferred embodiment of the present invention.

A liquid-cooling radiator able to improve the heat dissipation effect comprises liquid pipes 10, heat-dissipating fins 107 arranged on the liquid pipes 10, two reservoirs 20, a liquid-collecting box 30, a liquid pump 40, and a heat-dissipating base 60.

The liquid-collecting box 30 is mounted in a liquid-collecting box mounting chamber 11. The liquid-collecting box 30 is partitioned into a cold liquid chamber 31, a liquid pump mounting chamber 32, and a hot liquid chamber 33. The liquid pump 40 is mounted in the liquid pump mounting chamber 32. The heat-dissipating base 60 is mounted to the bottom of the liquid-collecting box 30. The two reservoirs 20 are mounted to two ends of the liquid pipes 10. The reservoir 20 at one end is partitioned into a first cold liquid reservoir 23 and a second cold liquid reservoir 24. The reservoir 20 at the other end is partitioned into a first hot liquid reservoir 21 and a second hot liquid reservoir 22. The liquid pipes 10 includes first return liquid pipes 101 and second return liquid pipes 102 located at two sides of the liquid-collecting box mounting chamber 11. The cold liquid in the first cold liquid reservoir 23 and the second cold liquid reservoir 24 respectively flows into the cold liquid chamber 31, and then flows through the heat-dissipating base 60 together. The cold liquid absorbs the heat from the heat-dissipating base 60 to become a hot liquid. The liquid pump 40 pumps the hot liquid to the liquid pump mounting chamber 32, and then the hot liquid flows from the liquid pump mounting chamber 32 into the hot liquid chamber 33. The hot liquid in the hot liquid chamber 33 flows to the first hot liquid reservoir 21 and the second hot liquid reservoir 22. The hot liquid in the first hot liquid reservoir 21 flows through the first return liquid pipes 101 to become the cold liquid to flow back to the first cold liquid reservoir 23, and the hot liquid in the second hot liquid reservoir 22 flows through the second return liquid pipes 102 to become the cold liquid to flow back to the second cold liquid reservoir 24, thereby forming a bilateral circulation. The liquid pipes 10 are divided into the left and right halves of circulation through the reservoir 20, which effectively improves the balance and stability of the liquid flow and has a better heat dissipation effect.

The liquid-cooling radiator further comprises a liquid-cooling block 50. The liquid-cooling block 50 is mounted to the bottom of the liquid-collecting box 30. The heat-dissipating base 60 is mounted to the bottom of the liquid-cooling block 50 for contacting a heat source. The liquid pipes 10 are arranged side by side and surround a liquid-collecting box mounting chamber 11. Taking the direction defined in FIG. 3 as an example (the direction is not limited thereto), the liquid pipes 10 includes a group of first return liquid pipes 101 and a group of second return liquid pipes 102 respectively located at the left and right sides of the liquid-collecting box mounting chamber 11, a group of first cold liquid pipes 105 and a group of second cold liquid pipes 106 that are spaced and arranged at the rear end of the liquid-collecting box mounting chamber 11, a group of first hot liquid pipes 103 and a group of second hot liquid pipes 104 that are spaced and arranged at the front end of the liquid-collecting box mounting chamber 11. The front ends of the first cold liquid pipes 105 and the second cold liquid pipes 106 communicate with the cold liquid chamber 31. The rear ends of the first hot liquid pipes 103 and the second hot liquid pipes 104 communicate with the hot liquid chamber 33.

Figure 3:
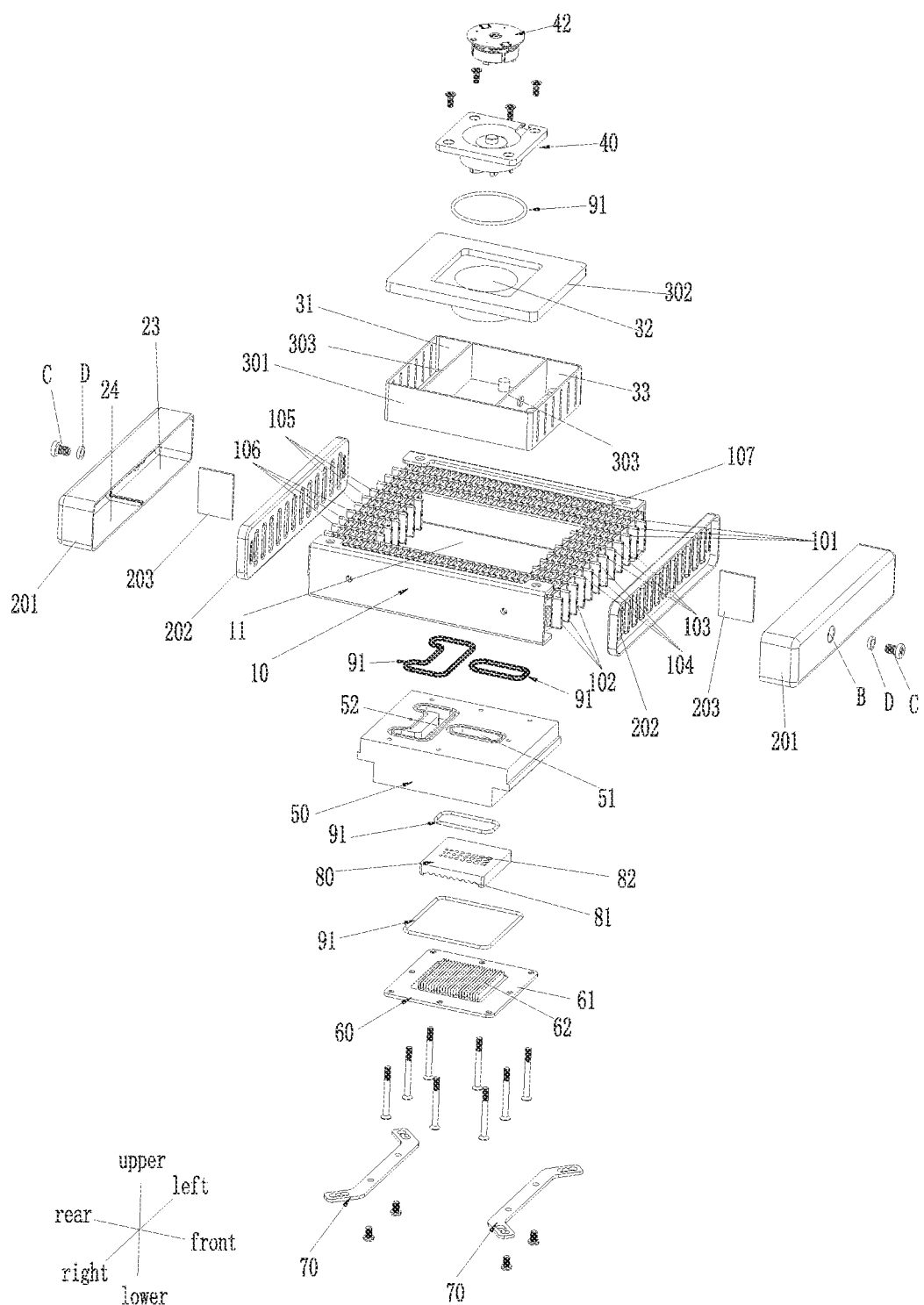
FIG. 3 is an exploded view according to the preferred embodiment of the present invention.
Figure 4:
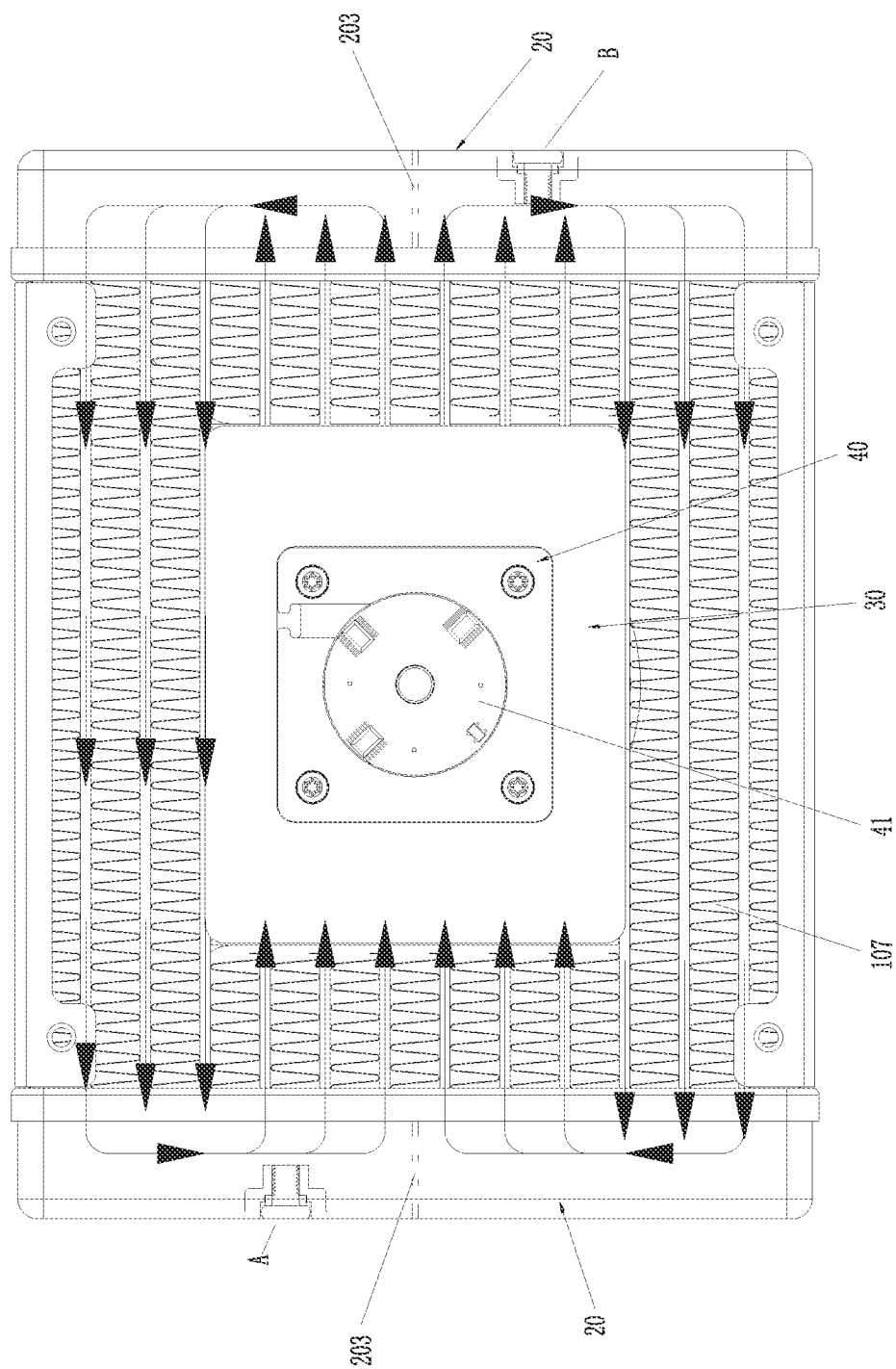
FIG. 4 is a schematic view showing the liquid flow direction according to the preferred embodiment of the present invention.

The reservoirs 20 are mounted to the front and rear ends of the liquid pipes 10, respectively. The reservoir 20 at the rear end is partitioned into the first cold liquid reservoir 23 and the second cold liquid reservoir 24. The reservoir 20 at the front end is partitioned into the first hot liquid reservoir 21 and the second hot liquid reservoir 22. A second partition 203 is provided in the reservoir 20. For example, the second partition 203 is centrally installed to partition the reservoir 20 equally. The rear ends of the first return liquid pipes 101 and the first cold liquid pipes 105 communicate with the first cold liquid reservoir 23. The front ends of the first return liquid pipes 101 and the first hot liquid pipes 103 communicate with the first hot liquid reservoir 21. The rear ends of the second return liquid pipes 102 and the second cold liquid pipes 106 communicate with the second cold liquid reservoir 24. The front ends of the second return liquid pipes 102 and the second hot liquid pipes 104 communicate with the second hot liquid reservoir 22. As shown in FIG. 3, the reservoir 20 includes a reservoir body 201 and a connecting cover 202 mounted to the reservoir body 201. The connecting cover 202 is formed with a plurality of holes for installation of the corresponding liquid pipes.

A fastener 70 is locked to the liquid-cooling block 50 by fastener screws 71.

The heat-dissipating base 60 has a bottom plate 61 and fins 62 integrally formed and connected to the bottom plate 61. The upper side of the bottom plate 61 is provided with a liquid-separating cover 80 for covering the fins 62 integrally formed and connected to the bottom plate 61. The top of the liquid-separating cover 80 has a cold liquid input hole 82. The circumferential side of the liquid-separating cover 80 has a hot liquid output hole 81. A cold liquid output hole 311 is provided at the bottom of the cold liquid chamber 31. A hot liquid input hole is provided between the hot liquid chamber 33 and the liquid pump mounting chamber 32. The liquid-cooling block 50 has a hot liquid flow channel 51 and a cold liquid flow channel 52. The cold liquid flows through the cold liquid output hole 311 of the cold liquid chamber 31 into the cold liquid flow channel 52, and then flows into the liquid-separating cover 80 via the cold liquid input hole 82 of the liquid-separating cover 80 to transfer the heat with the heat-dissipating base 60 to become the hot liquid. The hot liquid flows from the hot liquid output hole 81 on the circumferential side of the liquid-separating cover 80 to the hot liquid flow channel 51, and then flows from the hot liquid flow channel 51 to the liquid pump mounting chamber 33.

Figure 5:
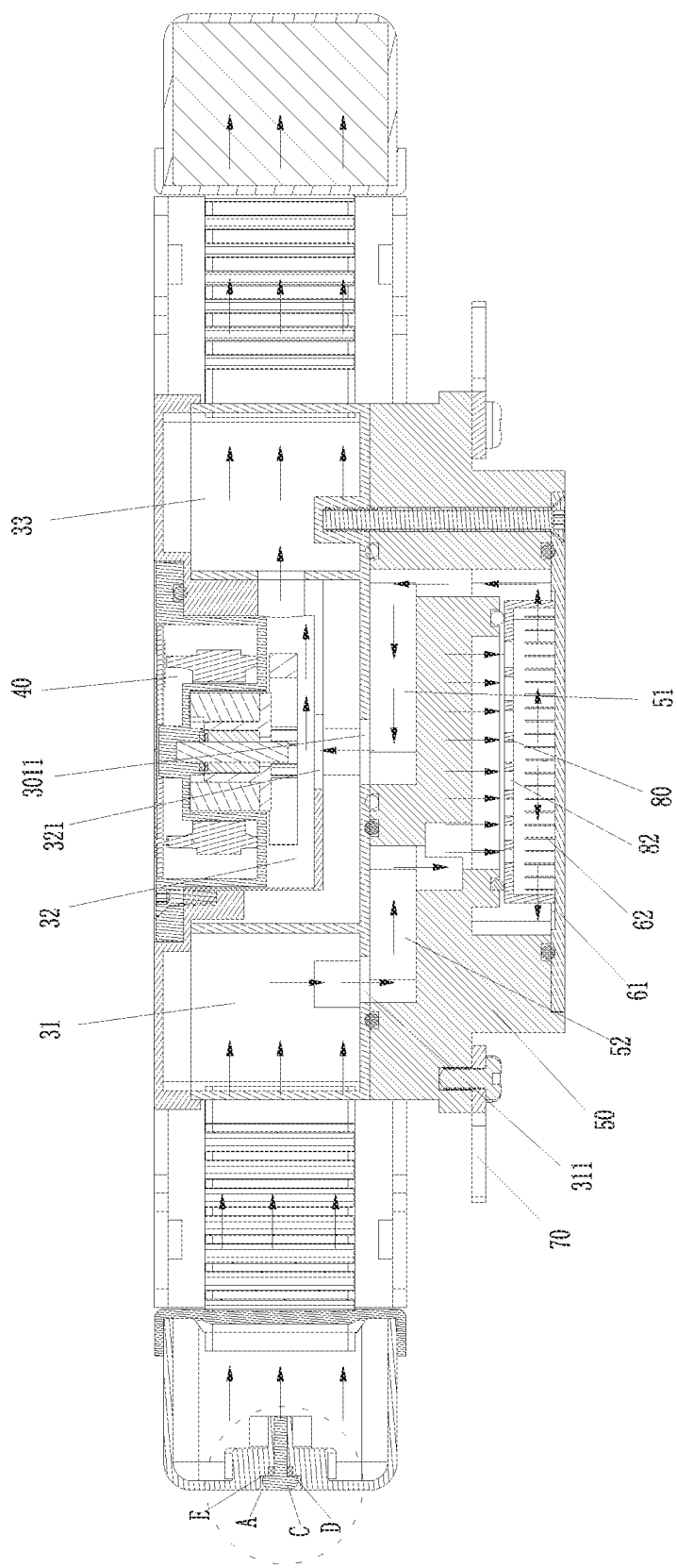
FIG. 5 is a cross-sectional view according to the preferred embodiment of the present invention, illustrating the liquid flow direction.
Figure 6:
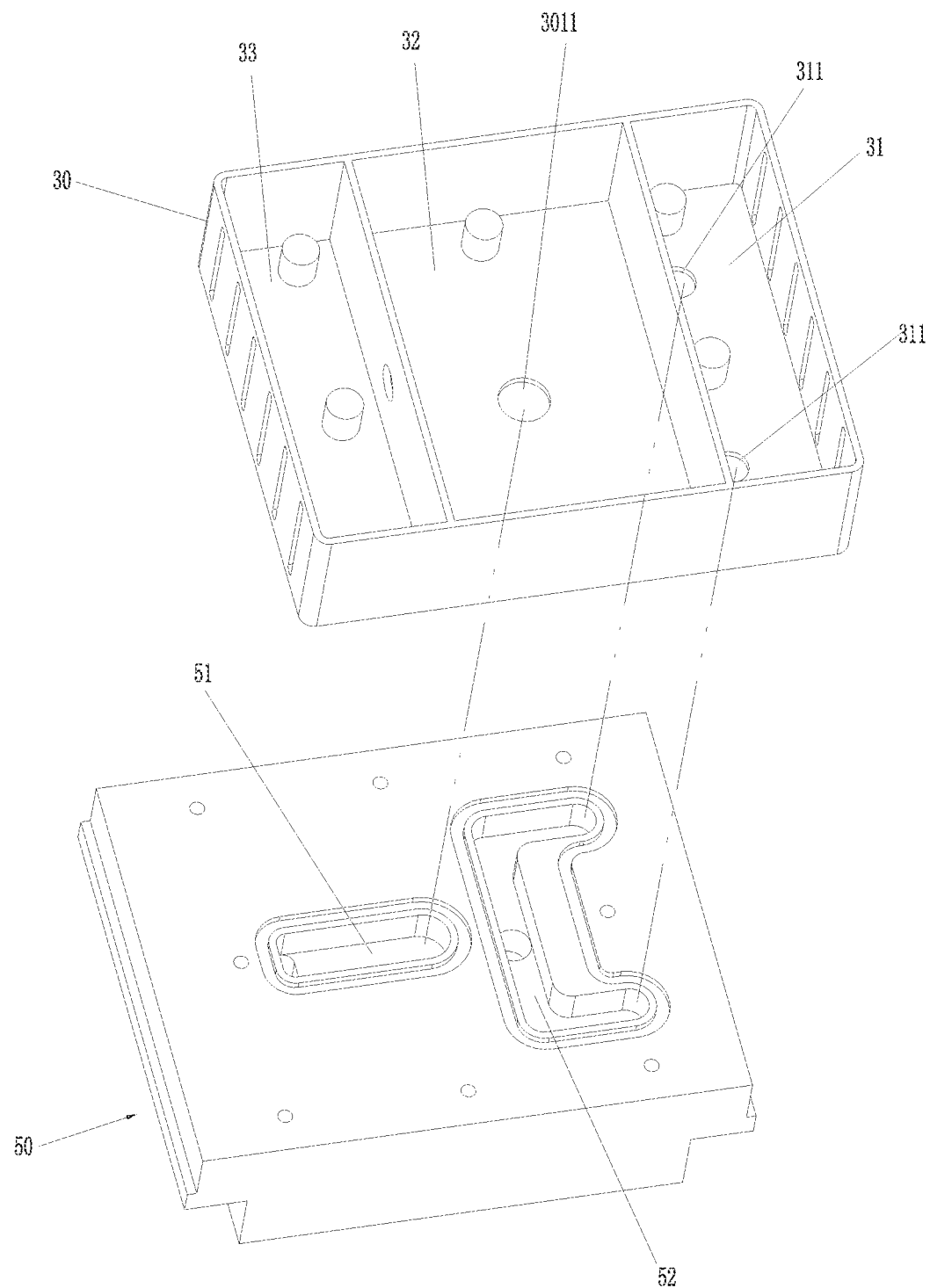
FIG. 6 is an exploded view of the liquid-collecting box and the liquid-cooling block according to the preferred embodiment of the present invention.
Figure 7:
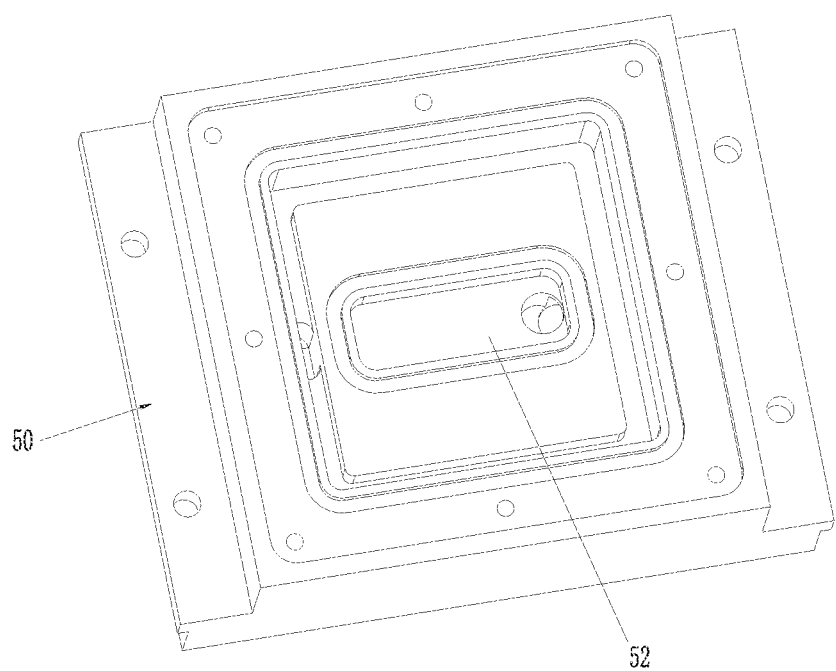
FIG. 7 is a perspective view of the liquid-cooling block according to the preferred embodiment of the present invention.
Figure 8:
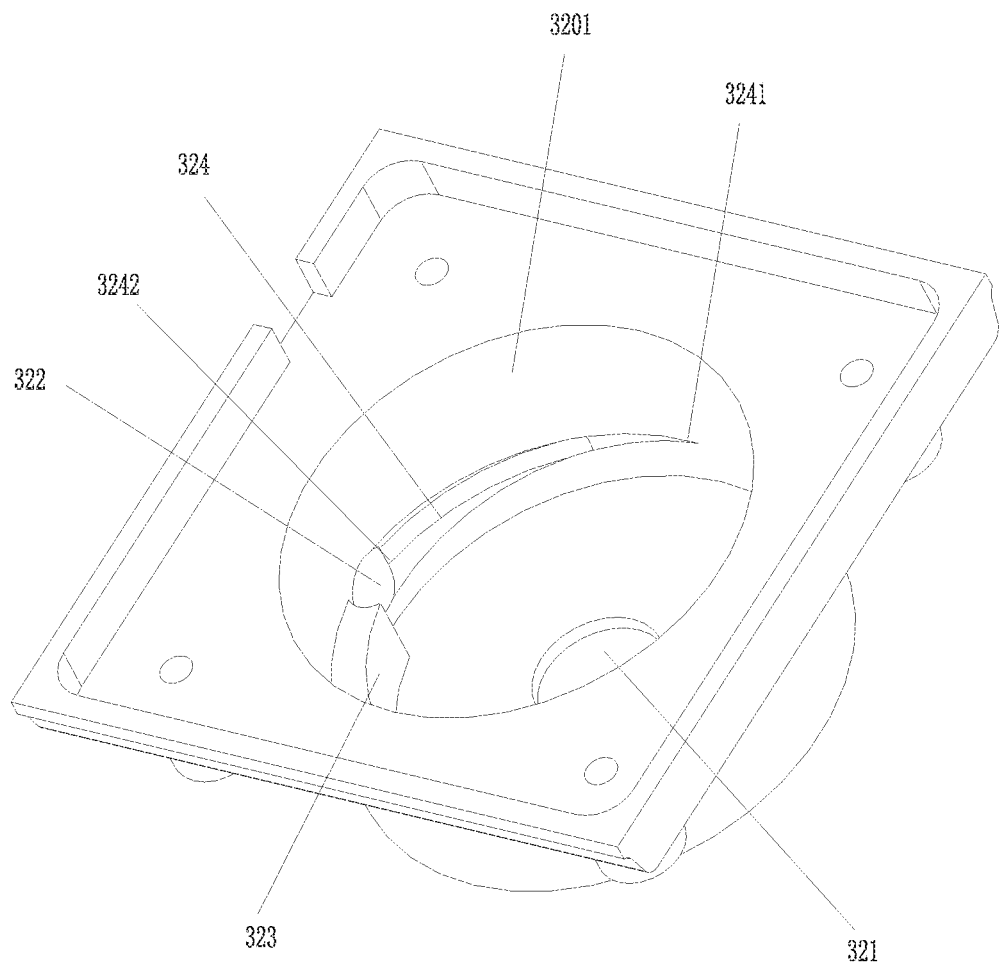
FIG. 8 is a perspective view of the liquid pump mounting chamber according to the preferred embodiment of the present invention.
Figure 9:
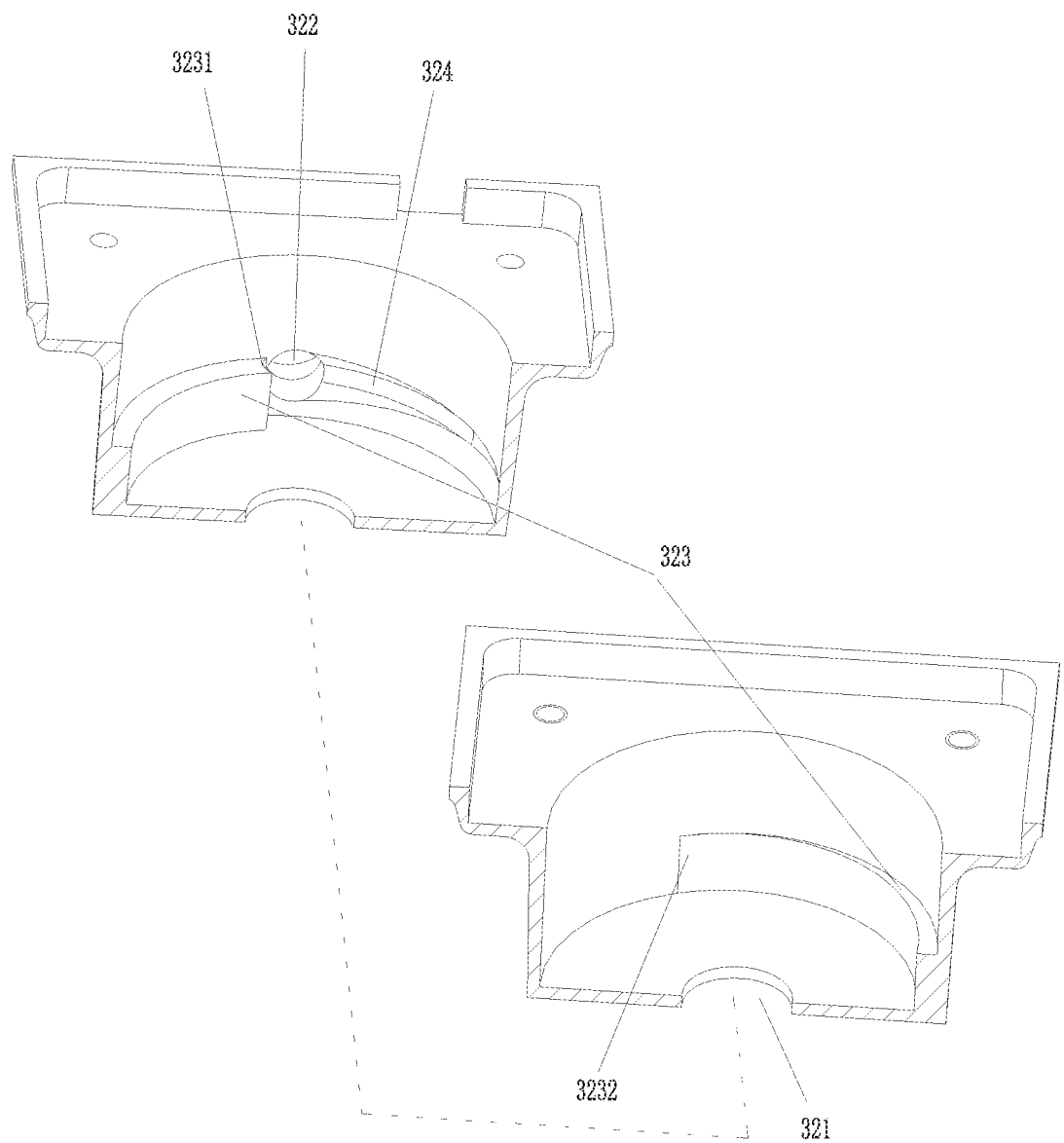
FIG. 9 is a cross-sectional view of the liquid pump mounting chamber according to the preferred embodiment of the present invention.

As shown in FIGS. 5-7, the cold liquid output hole 311 of the cold liquid chamber 31 includes a left cold liquid output hole and a right cold liquid output hole that are spaced apart from each other and correspond in position to the group of first cold liquid pipes 105 and the group of second cold liquid pipes 106, respectively. The cold liquid flow channel 52 has two inlets corresponding to the left and right cold liquid output holes 311 of the cold liquid chamber 31. The cold liquid flow channel 52 has two branches extending from the respective inlets. The two branches extend to an outlet of the cold liquid flow channel 52 after being joined.

The outlet of the cold liquid flow channel 52 corresponds to and is located above the cold liquid input hole 82 of the liquid-separating cover 80.

The hot liquid flow channel 51 has an inlet corresponding to the circumferential side of the liquid-separating cover 80 and an outlet located below the liquid pump 40. The hot liquid flow channel 51 extends upward from its inlet to the top of the liquid-separating cover 80, and is located below the liquid pump 40. The hot liquid is pumped by the liquid pump 40 to flow from one side of the liquid pump 40 to the hot liquid chamber 33.

The liquid-cooling block 50 and the heat-dissipating base 60 are sequentially attached to the bottom of the liquid-collecting box 30. The bottom of the liquid-collection box 30 is recessed with an inner threaded hole whose upper end is a blind end. A screw passes through the bottom plate 61 the liquid-cooling block 50 to be threadedly connected to the inner threaded hole. A first leak-proof sealing ring 91 is provided between the liquid-cooling block 50 and the liquid-collecting box 30, between the liquid-cooling block 50 and the bottom plate 61, between the liquid-cooling block 50 and the liquid-separating cover 80, and between the liquid pump 40 and a box cover 302.

The liquid-collecting box 30 includes a box body 301 and a box cover 302 assembled on the box body 301. Two ends of the box body 301 are formed with a plurality of mounting holes corresponding to the first cold liquid pipes 105, the second cold liquid pipes 106, the first hot liquid pipes 103, and the second hot liquid pipes 104, respectively. The box body 301 is partitioned into the cold liquid chamber 31, the liquid pump mounting chamber 32 and the hot liquid chamber 33 by first partitions 303. Part of the box cover 302 extends into the box body 301. The liquid pump mounting chamber 32 is recessed from the top of the box cover 302. The top of the box cover 302 is provided with a printed circuit board 42. The cold liquid output hole 311 is defined in the box cover 302. The bottom of the box body 301 is formed with a through hole 3011 communicating with the outlet of the hot liquid flow channel 51.

The first return liquid pipes 101, the second return liquid pipes 102, the first cold liquid pipes 105, the second cold liquid pipes 106, the first hot liquid pipes 103 and the second hot liquid pipes 104 each may be single or plural. The heat-dissipating fins 107 arranged on the liquid pipes are located between every adjacent two of the liquid pipes, and may be welded, tightly fitted, or the like.

Figure 14:
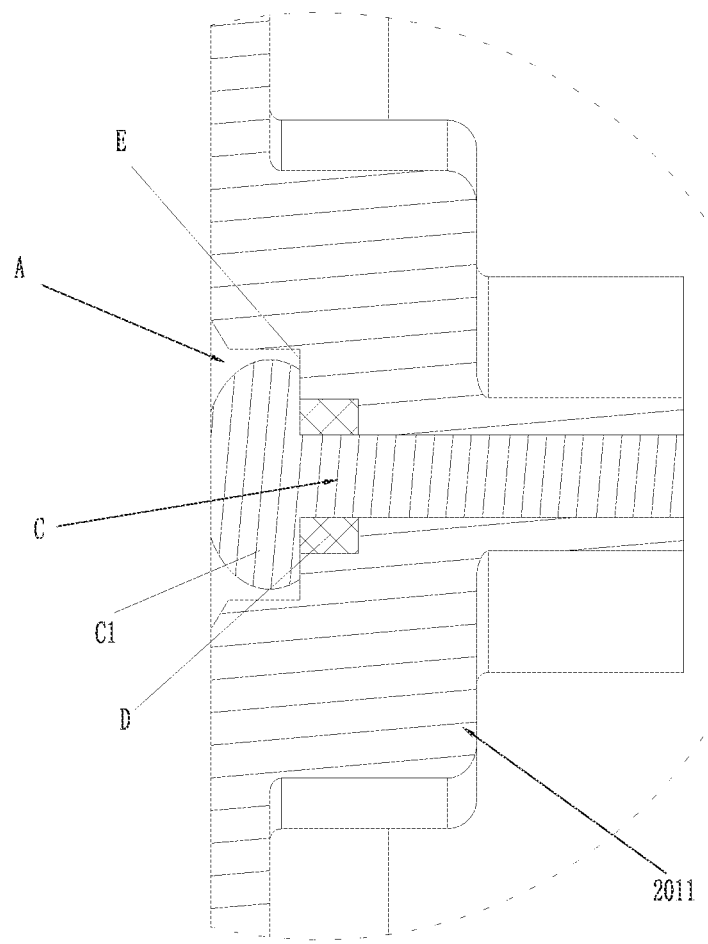
FIG. 14 is a partial enlarged view of FIG. 5.
Figure 15:
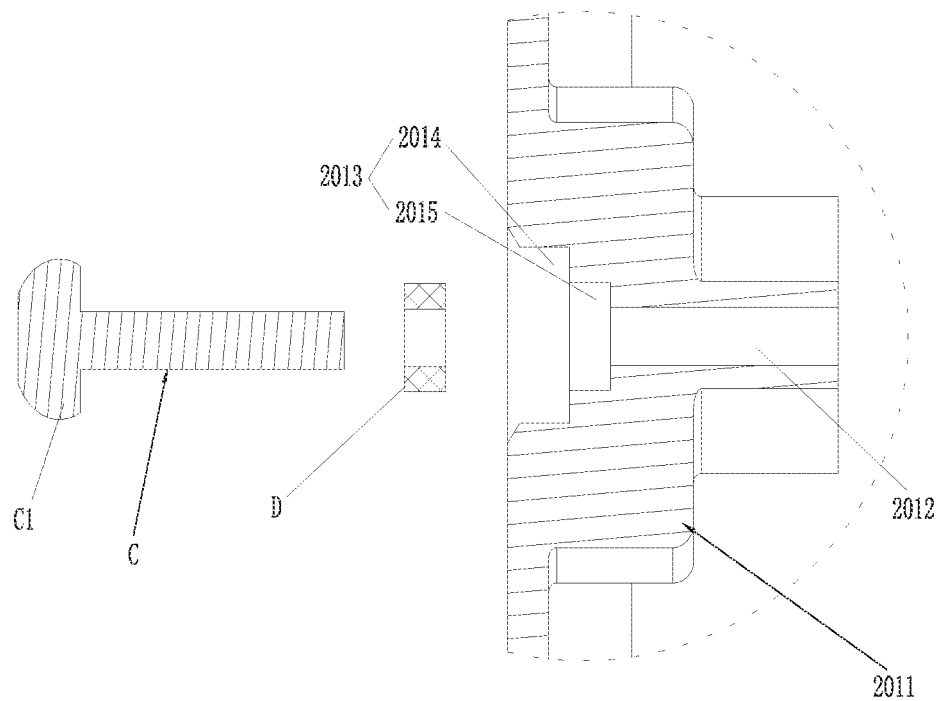
FIG. 15 is a partial cross-sectional view of FIG. 5, wherein the locking screw and the leak-proof sealing ring are not installed.

The first cold liquid reservoir 23 or the second cold liquid reservoir 24 of the reservoir 20 at the rear end is provided with a first liquid injection port A. The first hot liquid reservoir 21 or the second hot liquid reservoir 22 of the reservoir 20 at the front end is provided with a second liquid injection port B. As shown in FIG. 5, FIG. 14 and FIG. 15, the inner wall surface of the reservoir 20 is integrally formed with a protruding portion 2011 having the first liquid injection port or the second liquid injection port. The first liquid injection port or the second liquid injection port includes an internal threaded hole 2012 and a stepped hole 2013. The internal threaded hole 2012 communicates with the interior of the reservoir 20. The stepped hole 2013 communicates with the internal threaded hole 2012 and the exterior of the reservoir 20. A locking screw C and a second leak-proof sealing ring D are provided in the first liquid injection port or the second liquid injection port. The second leak-proof sealing ring D is located between a nut portion C1 of the locking screw C and the inner end face of the stepped hole 2013. The locking screw C is screwed into the internal threaded hole 2012. When the locking screw C is tightened, the nut portion C1 squeezes the second leak-proof sealing ring D so that the second leak-proof sealing ring D is deformed and clamped between the nut portion C1 and the inner end face of the stepped hole 2013, so as to prevent leakage. The stepped hole 2013 includes a first stepped hole 2014 and a second stepped hole 2015 arranged inwardly in sequence and communicating with each other. The first stepped hole 2014 is larger than the second stepped hole 2015. The second leak-proof sealing ring D is located in the second stepped hole 2015. Before the second leak-proof sealing ring D is squeezed by the nut portion C1, the thickness of the second leak-proof sealing ring D is higher than a first step surface E of the first stepped hole 2014. When the locking screw C is tightened, the nut portion C1 squeezes the second leak-proof sealing ring D until the nut portion C1 abuts against the first step surface E, so that the second leak-proof sealing ring D is deformed to fill the second stepped hole 2015, so as to prevent leakage.

Figure 10:
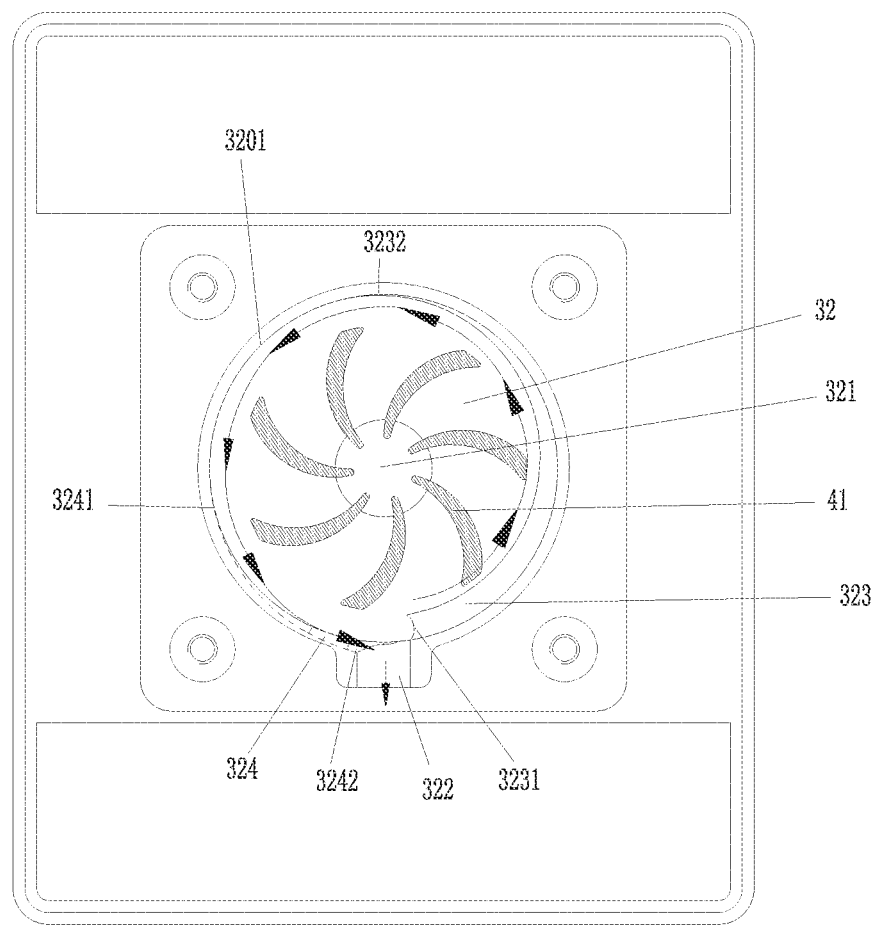
FIG. 10 is a schematic view showing the application of the liquid pump mounting chamber according to the preferred embodiment of the present invention.
Figure 11:
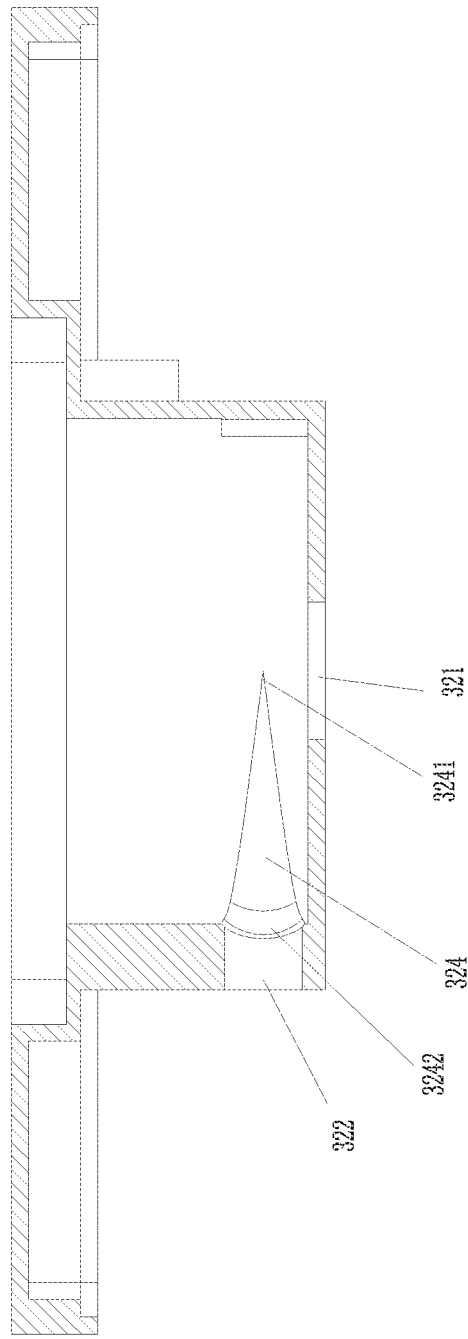
FIG. 11 is a cross-sectional view of the liquid pump mounting chamber according to the preferred embodiment of the present invention, wherein the guide groove is an arc-shaped groove.
Figure 12:
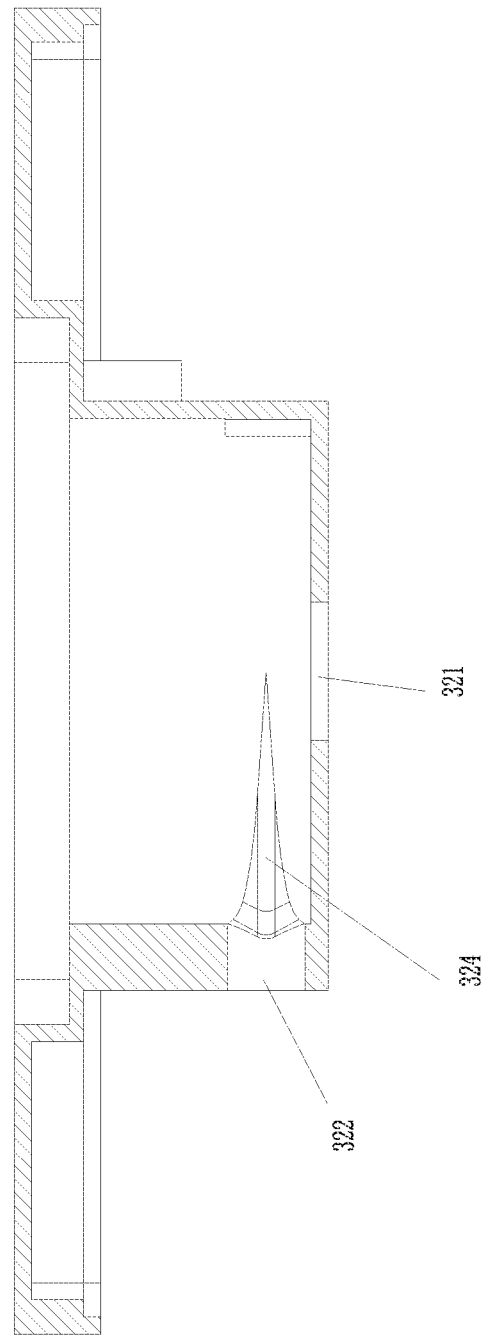
FIG. 12 is a cross-sectional view of the liquid pump mounting chamber according to the preferred embodiment of the present invention, wherein the guide groove is a V-shaped groove.
Figure 13:
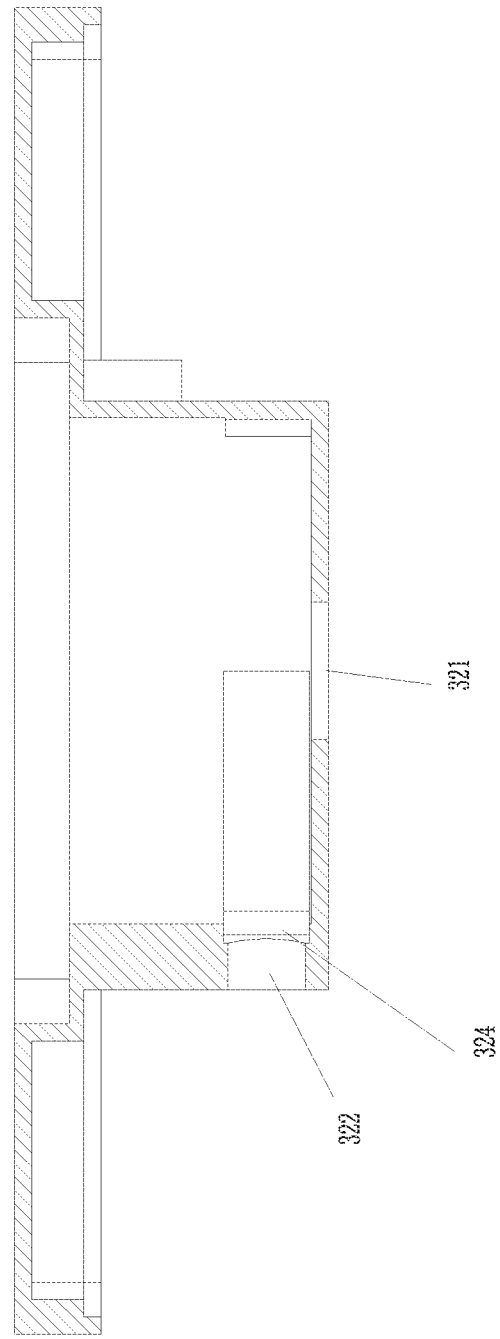
FIG. 13 is a cross-sectional view of the liquid pump mounting chamber according to the preferred embodiment of the present invention, wherein the guide groove is a rectangular groove.

As shown in FIGS. 8-13, the bottom of the liquid pump mounting chamber 32 is centrally formed with a liquid inlet 321. The peripheral side of the liquid pump mounting chamber 32 is formed with a liquid outlet 322. The inner wall 3201 of the peripheral side of the liquid pump mounting chamber 32 is convexly provided with a protruding boss 323 corresponding to one side of the liquid outlet 322, and is concavely provided with a guide groove 324 corresponding to the other side of the liquid outlet 322. Both the protruding boss 323 and the guide groove 324 are perpendicular to the inner wall 3201 of the peripheral side of the liquid pump mounting chamber 32. The protruding boss 323 is gradually thinned along the rotating direction (the direction shown by the arrow in FIG. 10) of the impeller 41. The guide groove 324 is gradually deepened along the rotating direction of the impeller 41 and communicates with the liquid outlet 322, and the guide groove 324 is gradually widened along the rotating direction of the impeller 41. As shown in FIG. 10, the distal end 3231 of the protruding boss 323 extends to a position opposite to the liquid outlet 322. The starting end 3241 of the guide groove 324 is spaced a determined distance apart from the distal end 3231 of the protruding boss 323. The liquid is rotated along the protruding boss 323. The liquid-containing space is gradually enlarged until the maximum area between the distal end 3231 of the protruding boss 323 and the starting end 3241 of the guide groove 324. From the starting end 3241 of the guide groove 324, the liquid is rotated and guided to flow along the guide groove 324 to the liquid outlet 322. The guide groove 324 is gradually widened and deepened toward the liquid outlet 322, which is beneficial for the liquid to quickly pass through the guide groove 324 to the liquid outlet 322. Preferably, the starting end 3232 of the protruding boss 323 is a concave arcuate surface. When the liquid flushes to the starting end 3232 of the protruding boss 323, the concave arcuate surface provides a partial stop function for the liquid to flow back to the liquid outlet 322, so as to ensure the liquid output of the liquid outlet 322. The guide groove 324 may have an arc-shaped, V-shaped or rectangular cross-section.

What is claimed is:

1. A liquid-cooling radiator, comprising liquid pipes, heat-dissipating fins arranged on the liquid pipes, two reservoirs, a liquid-collecting box, a liquid pump, a heat-dissipating base, and a liquid-cooling block;

the liquid-collecting box being mounted in a liquid-collecting box mounting chamber, the liquid-collecting box being partitioned into a cold liquid chamber, a liquid pump mounting chamber and a hot liquid chamber, the liquid pump being mounted in the liquid pump mounting chamber; the heat-dissipating base being situated below a bottom of the liquid-collecting box;

the two reservoirs being mounted to two ends of the liquid pipes respectively, the reservoir at one end being partitioned into a first cold liquid reservoir and a second cold liquid reservoir, the reservoir at the other end being partitioned into a first hot liquid reservoir and a second hot liquid reservoir; the liquid pipes including first return liquid pipes and second return liquid pipes located at two sides of the liquid-collecting box mounting chamber;

wherein a cold liquid in the first cold liquid reservoir and the second cold liquid reservoir respectively flows into the cold liquid chamber and then flows through the heat-dissipating base together, the cold liquid absorbs heat from the heat-dissipating base to become a hot liquid, the liquid pump pumps the hot liquid to the liquid pump mounting chamber, and then the hot liquid flows from the liquid pump mounting chamber into the hot liquid chamber, the hot liquid in the hot liquid chamber flows to the first hot liquid reservoir and the second hot liquid reservoir, the hot liquid in the first hot liquid reservoir flows through the first return liquid pipes to become the cold liquid to flow back to the first cold liquid reservoir, and the hot liquid in the second hot liquid reservoir flows through the second return liquid pipes to become the cold liquid to flow back to the second cold liquid reservoir, thereby forming a bilateral circulation;

the liquid-cooling block being mounted to the bottom of the liquid-collecting box, the heat-dissipating base being mounted to a bottom of the liquid-cooling block for contacting a heat source;

wherein the heat-dissipating base has a bottom plate and fins integrally formed and connected to the bottom plate, an upper side of the bottom plate is provided with a liquid-separating cover for covering the fins integrally formed and connected to the bottom plate, a top of the liquid-separating cover has a cold liquid input hole, a circumferential side of the liquid-separating cover has a hot liquid output hole; a cold liquid output hole is provided at a bottom of the cold liquid chamber, a hot liquid input hole is provided between the hot liquid chamber and the liquid pump mounting chamber; the liquid-cooling block has a hot liquid flow channel and a cold liquid flow channel;

the cold liquid flows through the cold liquid output hole of the cold liquid chamber into the cold liquid flow channel, and then flows into the liquid-separating cover via the cold liquid input hole of the liquid-separating cover to transfer the heat with the heat-dissipating base to become the hot liquid, and the hot liquid flows from the hot liquid output hole on the circumferential side of the liquid-separating cover to the hot liquid flow channel and then flows from the hot liquid flow channel to the liquid pump mounting chamber.

2. The liquid-cooling radiator as claimed in claim 1, wherein the cold liquid output hole of the cold liquid chamber includes a left cold liquid output hole and a right cold liquid output hole that are spaced apart from each other and correspond in position to a group of first cold liquid pipes and a group of second cold liquid pipes, respectively; the cold liquid flow channel has two inlets corresponding to the left and right cold liquid output holes of the cold liquid chamber, the cold liquid flow channel has two branches extending from the respective inlets, the two branches extend to an outlet of the cold liquid flow channel after being joined; the outlet of the cold liquid flow channel corresponds to and is located above the cold liquid input hole of the liquid-separating cover;

the hot liquid flow channel has an inlet corresponding to the circumferential side of the liquid-separating cover and an outlet located below the liquid pump, the hot liquid flow channel extends upward from its inlet to the top of the liquid-separating cover and is located below the liquid pump, and the hot liquid is pumped by the liquid pump to flow from one side of the liquid pump to the hot liquid chamber.

3. The liquid-cooling radiator as claimed in claim 1, wherein the liquid-cooling block and the heat-dissipating base are sequentially attached to the bottom of the liquid-collecting box, the bottom of the liquid-collection box is recessed with an inner threaded hole whose upper end is a blind end, a screw passes through a bottom plate and the liquid-cooling block to be threadedly connected to the inner threaded hole; a first leak-proof sealing ring is provided between the liquid-cooling block and the liquid-collecting box, between the liquid-cooling block and the bottom plate and between the liquid-cooling block and a cover capable of separating liquid.

4. The liquid-cooling radiator as claimed in claim 1, wherein the liquid-collecting box includes a box body and a box cover assembled on the box body; the box body is partitioned into the cold liquid chamber, the liquid pump mounting chamber and the hot liquid chamber by first partitions; part of the box cover extends into the box body, and the liquid pump mounting chamber is recessed from a top of the box cover.

5. The liquid-cooling radiator as claimed in claim 1, wherein a bottom of the liquid pump mounting chamber is centrally formed with a liquid inlet, a peripheral side of the liquid pump mounting chamber is formed with a liquid outlet; an inner wall of the peripheral side of the liquid pump mounting chamber is convexly provided with a protruding boss corresponding to one side of the liquid outlet and is concavely provided with a guide groove corresponding to another side of the liquid outlet; the protruding boss is gradually thinned along a rotating direction of an impeller, and the guide groove is gradually deepened along the rotating direction of the impeller and communicating with the liquid outlet.

6. The liquid-cooling radiator as claimed in claim 1, wherein one of the first cold liquid reservoir and the second cold liquid reservoir of the reservoir at one end is provided with a first liquid injection port ; one of the first hot liquid reservoir and the second hot liquid reservoir of the reservoir at the other end is provided with a second liquid injection port.

7. The liquid-cooling radiator as claimed in claim 6, wherein an inner wall surface of each reservoir is integrally formed with a protruding portion having the first liquid injection port or the second liquid injection; the first liquid injection port or the second liquid injection includes an internal threaded hole and a stepped hole, the internal threaded hole communicates with an interior of the reservoir, the stepped hole communicates with the internal threaded hole and an exterior of the reservoir;

a locking screw and a second leak-proof sealing ring are provided in the first liquid injection port or the second liquid injection port, the second leak-proof sealing ring is located between a nut portion of the locking screw and an inner end face of the stepped hole, the locking screw is screwed into the internal threaded hole, when the locking screw is tightened, the nut portion squeezes the second leak-proof sealing ring so that the second leak-proof sealing ring is deformed and clamped between the nut portion and the inner end face of the stepped hole, so as to prevent leakage.

8. The liquid-cooling radiator as claimed in claim 7, wherein the stepped hole includes a first stepped hole and a second stepped hole arranged inwardly in sequence and communicating with each other, the first stepped hole is larger than the second stepped hole, the second leak-proof sealing ring is located in the second stepped hole, before the second leak-proof sealing ring is squeezed by the nut portion, a thickness of the second leak-proof sealing ring is higher than a first step surface of the first stepped hole, when the locking screw is tightened, the nut portion squeezes the second leak-proof sealing ring until the nut portion abuts against the first step surface, so that the second leak-proof sealing ring is deformed to fill the second stepped hole, so as to prevent leakage.

* * * * *